United States Patent [19]

Nakamura

[11] Patent Number: 4,599,122
[45] Date of Patent: Jul. 8, 1986

[54] METHOD OF TAPING SEPARATION FILMS FOR PHOTOENGRAVING AND APPARATUS THEREFOR

[75] Inventor: Samuro Nakamura, Nagoya, Japan

[73] Assignee: Nakamura Purosesu Kogei Kabushiki Kaisha, Nagoya, Japan

[21] Appl. No.: 774,947

[22] Filed: Sep. 11, 1985

[30] Foreign Application Priority Data

Sep. 13, 1984 [JP] Japan .................. 59-193037
Sep. 17, 1984 [JP] Japan .................. 59-195355

[51] Int. Cl.$^4$ .............................. G03B 23/02
[52] U.S. Cl. .................. 156/64; 101/DIG. 12; 156/378; 156/379; 156/350; 355/40; 355/88
[58] Field of Search ............... 156/64, 378, 353, 521, 156/350, 556, 379; 355/40, 53, 86, 88, 95, 99; 101/DIG. 12

[56] References Cited

U.S. PATENT DOCUMENTS 3,704,945 12/1972 Denis et al. .................. 355/72 X
4,018,528 4/1977 Denis et al. ............. 101/DIG. 12 X Primary Examiner—David Simmons
Attorney, Agent, or Firm—Dennison, Meserole, Pollack & Scheiner

[57] ABSTRACT

A method and apparatus are presented for taping color separation films on a transparent base film to be used for making a printing plate for reproduction by photoengraving. The method comprises the steps of inputting to a computer taping orders of the separation films and taping positions on the transparent base film at which the separation films are to be taped on the basis of the X-Y coordinates and setting angle determined from punched holes formed in the transparent base film and register marks put on the separation films; arranging the separation films in the order in which they are to be taped on the transparent base film; positioning in sequence the separation films to be taped on the base film to a predetermined point of origin; holding in sequence the separation films positioned at the point of origin; transferring in sequence the separation films to the taping positions previously stored in the computer; and taping in sequence the separation films on the base film. Apparatus for performing the method is disclosed which includes the selecting of the separation films, the sensing of register marks of the selected film, the taping of the film on a transparent base film and the transport of the finished film to a storage.

8 Claims, 15 Drawing Figures

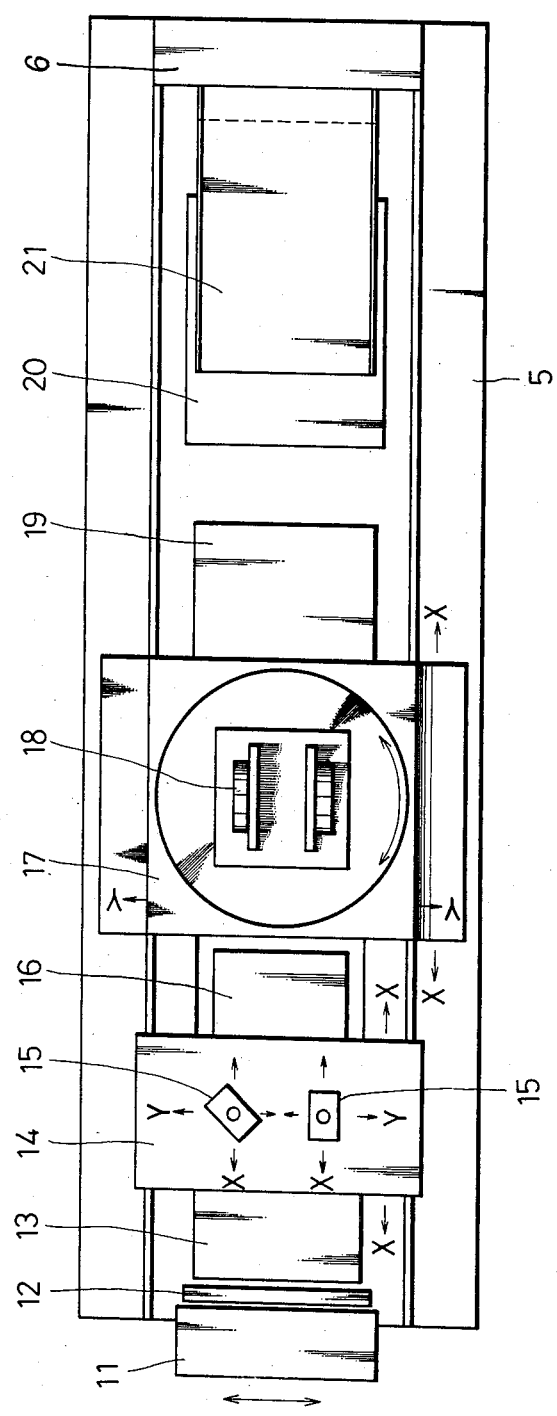
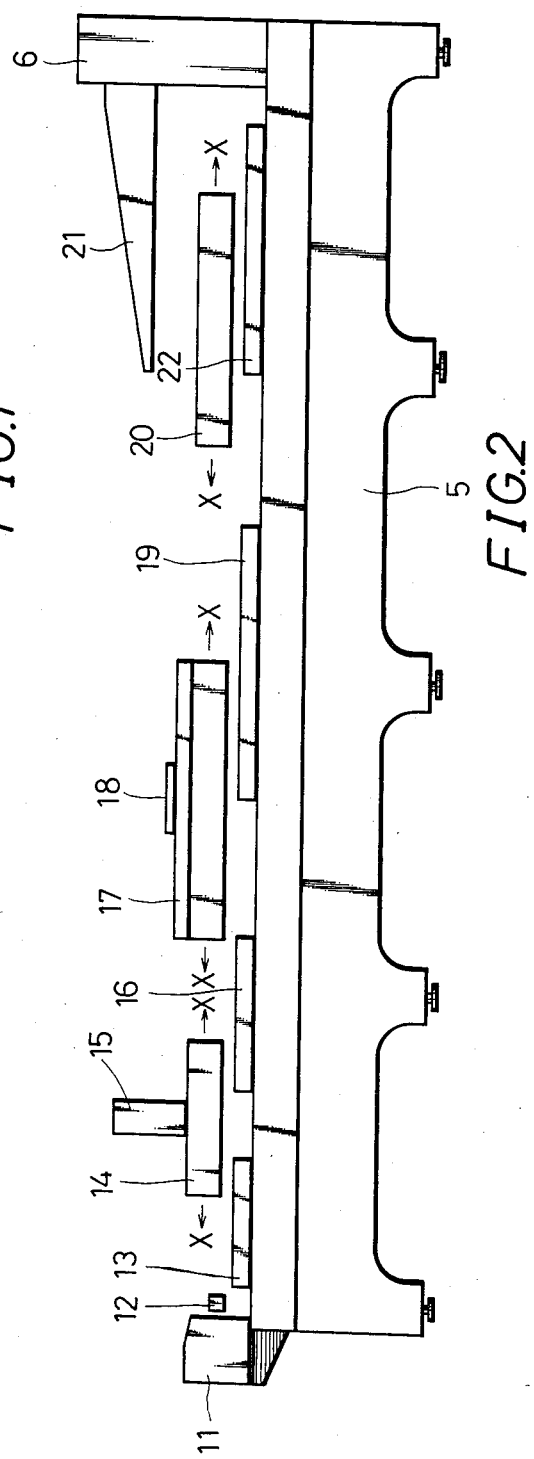

METHOD OF TAPING SEPARATION FILMS FOR PHOTOENGRAVING AND APPARATUS THEREFOR

BACKGROUND OF THE INVENTION

1. Field of the Invention

The present invention relates to a method of and apparatus for taping color separation films on a transparent base film for making a printing flat for reproduction by photoengraving, particularly in a multi-color printing.

2. Description of the Prior Art

In general, a multi-color printing requires preparation of a plurality of transparent base films on each of which separation films are taped corresponding to color-separated printing flats. Conventionally, such a printing flat is prepared by accurately positioning each separation film on the transparent base film on the basis of punched holes formed in the transparent base film and taping it thereto. The separation films are, in many cases, different in size, orientation, number to be taped and other factors and they must be taped on the transparent base film by means of adhesive tape. All of these factors make it hard to automate the taping operation. Furthermore, as positioning of the films must be effected on the order of 1/1000 mm reproducibility in order to prevent possible color shear, the automation, even if possible, has lagged in realization. Any automation has been limited only to a part of the operations, and on the whole, manual handling has been indispensable. Thus, taping of separation films has been an operation requiring considerable labor, time and cost.

SUMMARY OF THE INVENTION

It is, therefore, the primary object of the present invention to automatically tape color separation films on a transparent base film for making a color-separated printing flat in a multi-color printing with high degree of accuracy of positioning and reproducibility.

According to the present invention, there is provided a method of taping color separation films on a transparent base film to be used for making a printing plate for reproduction by photoengraving. The method comprises the steps of inputting to a computer taping orders of the separation films and taping positions on the transparent base film at which the separation films are to be taped on the basis of the X-Y coordinates and setting angle determined from punched holes formed in the transparent base film and register marks put on the separation films; arranging the separation films in the order in which they are to be taped on the transparent base film; positioning in sequence the separation films to be taped on the base film to a predetermined point of origin; holding in sequence the separation films positioned at the point of origin; transferring in sequence the separation films to the taping positions previously stored in the computer; and taping in sequence the separation films on the base film.

Apparatus of this invention carries out this method, generally comprising a film storage for storing a plurality of color separation films; a film loader for taking out the separation films one after another from the film storage; a film centering platform for temporarily positioning the separation film at a specified located thereon; a transfer table for transferring the separation film including CCD (charge-coupled device) cameras for sensing the register marks of the separation film located on the film centering platform; a sensing table for positioning the temporarily-located film fed by the transfer table to a predetermined point of origin; a taping table for releasably gripping the separation film set at the point of origin including a taping device to tape the separation film on a base film; a base film suction platform for releasably carrying thereon the base film on which the separation film is taped by the taping device; and a base film carrier for delivering the finished base film from the base film suction platform to a finished film tray and for feeding a new base film from a plain base film storage to the base film suction platform.

The invention will become more fully apparent from the claims and the description as it proceeds in connection with the drawings.

BRIEF DESCRIPTION OF THE DRAWINGS

FIG. 1 is a schematic plan view of the automatic film taping apparatus for carrying out the method of the present invention;

FIG. 2 is a schematic front view of the apparatus shown in FIG. 1;

DETAILED DESCRIPTION OF THE INVENTION

Figure 15:
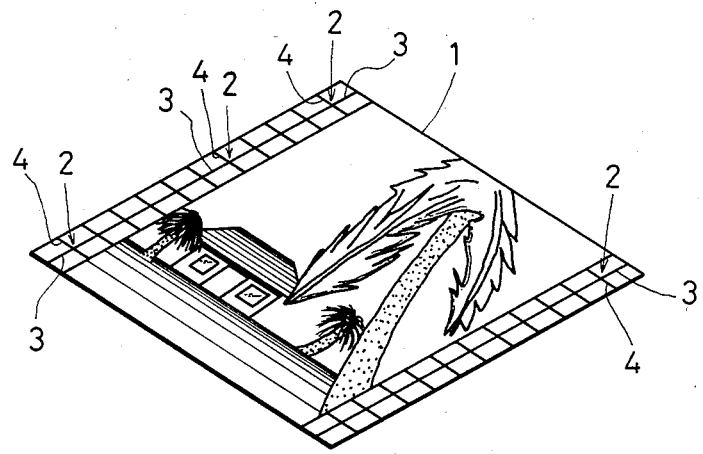
FIG. 15 is a schematic representation of a color separation film.

The drawings illustrate the automatic taping apparatus for performing the method of the invention. Referring to FIG. 15, shown therein is a color separation film 1 to be taped on a transparent base film. As shown therein, the separation film 1 has a plurality of crusiform register marks 2 consisting of a vertical and a horizontal line 3 and 4. The automatic apparatus for processing the separation films 1 includes the selecting of the separation films 1, the sensing of register marks 2 of the selected film 1, the taping of the film on a transparent base film and the transport of the finished film to a storage. FIG. 1 is a schematic plan view of the automatic taping apparatus. For convenience in describing the relative positions of the subassemblies and components, the left end of the apparatus illustrated in FIG. 1 is referred to as the front of the apparatus; and forward and rearward parts and movements as well as longitudinal and lateral directions will be in relation to this front of the apparatus. Especially, the longitudinal direction and the lateral direction are hereinafter referred to as "X direction" and "Y direction", respectively. The apparatus of FIG.

1 is supported in a generally horizontal plane relative to a floor surface on a suitable support frame 5. The support frame 5 has an upstanding frame 6 secured to the rearward end thereof.

Figure 3:
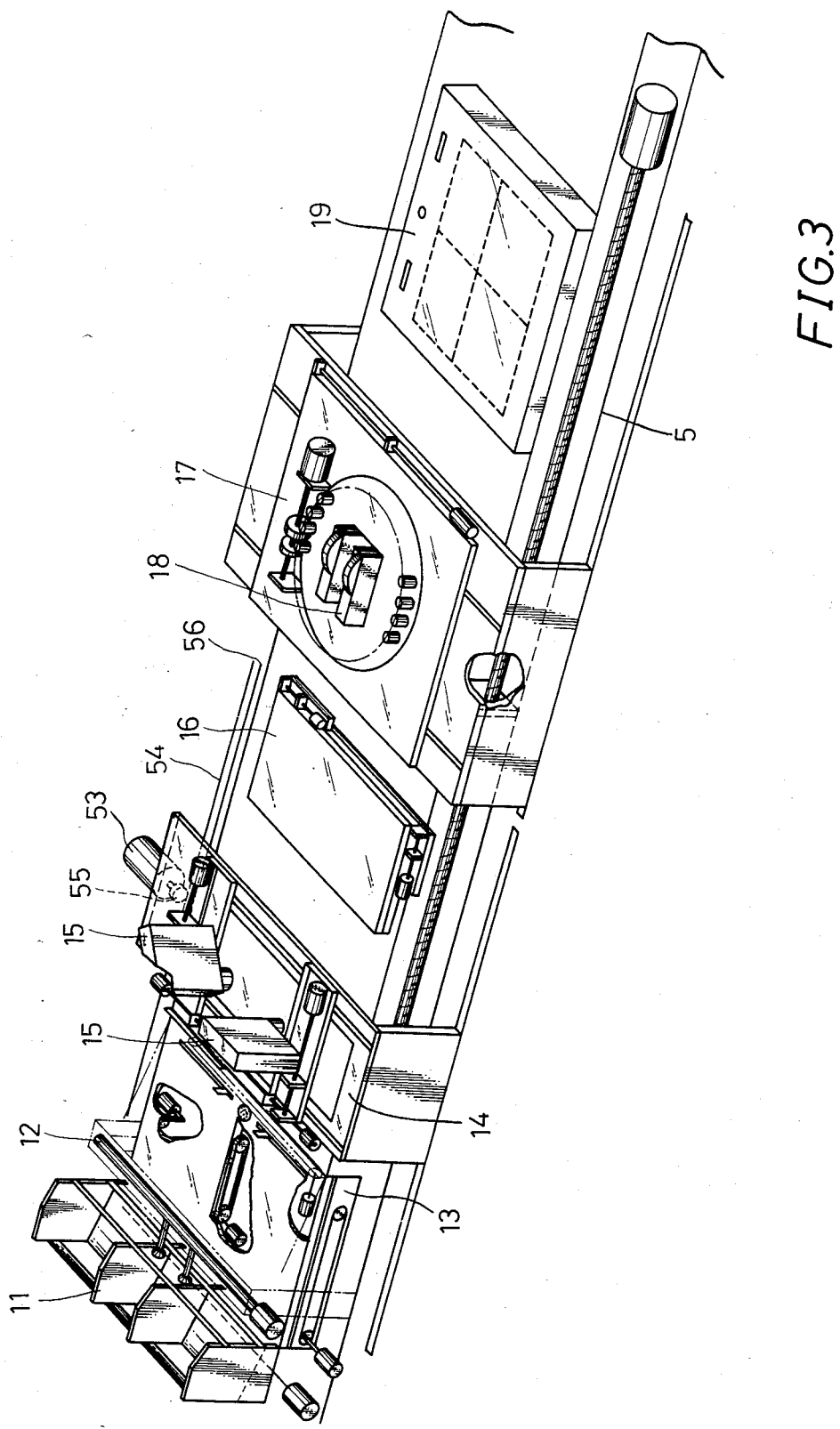
FIG. 3 is a schematic perspective view of the apparatus shown in FIG. 1.

Referring to FIGS. 1, 2 and 3, the principal subassemblies of the apparatus are a film storage 11, a film loader 12, a film centering platform 13, a transfer table 14, a sensing table 16, a taping table 17, a base film suction platform 19, a base film carrier 20, a finished film tray 21 and a plain base film storage 22. A brief description of each of the subassemblies of the apparatus follows.

The film storage 11 is mounted on the forward end of the support frame 5 of the apparatus and serves to store separation films that have been color-separated in such a manner as to be suitable for making multi-color printing flats. For this purpose, the films are classified by sizes, in the taping order previously stored in a computer associated with the apparatus, that is the order in which the films are to be taped on base films. The film loader 12 takes out the separation films one by one from the film loader 12. The film loader 12 is movable in the X direction above the film centering platform 13 secured to the support frame 5 and adapted to temporarily position the separation film at a specified location thereon.

The transfer table 14 is mounted to the support frame 5 adjacent the film centering platform 13 and is movable in the X direction to transfer the separation film. The transfer table 14 includes two CCD (charge-coupled device) cameras 15 for detecting at least two crusiform register marks 2 of the separation film temporarily positioned at the specified location on the film centering platform 13. The CCD cameras 15 serve to detect the position of the register mark 2 in one-dimensional plane, that is, either the vertical line 3 or the horizontal line 4 of the register mark 2. For this reason, at least one of the CCD cameras 15 is oriented obliquely with respect to the cross of the register mark 2, so that the intersecting vertical and horizontal lines 3 and 4 of the register mark 2 extend obliquely with respect to the detecting direction of the CCD camera 15. The positions of the two register marks 2 can be detected by the two CCD cameras 15 thus arranged, while the other CCD camera 15 detects only the vertical line 3 or the horizontal line 4 of the register mark 2, and thence the separation film may be positioned in place on the subsequent sensing table 16. The sensing table 16 is mounted on the support frame 5 and is adjustable for rotation and for movements in both X and Y directions. The task of the sensing table 16 is to precisely locate the separation film fed by the transfer table 14 from the specified temporary position on the film centering platform 13 to a point of origin determined on the basis of the position of a running base film to be held on the base film suction platform 19, that is a specified point of origin by which the separation film is taped on the base film.

The taping table 17 grips under vacuum the separation film located at the point of origin by the sensing table 16, moves it in both X and Y directions, rotates it and ultimately tapes it on the base film held on the base film suction platform 19. The taping table 17 includes a taping device 18 for taping the separation film on the base film.

The base film carrier 20 serves to deliver a transparent base film on which separation films are to be taped, from the plain base film storage 22 secured to the support frame 5 to the base film suction platform 19. The base film carrier 20 also deliver the finished base film from the base film suction platform 19 to the finished film tray 21 which is vertically movably supported on the upstanding frame 6 secured to the support frame 5.

Now, the above mentioned subassemblies of the automatic taping apparatus arranged along the process line will be described in detail.

Figure 4:
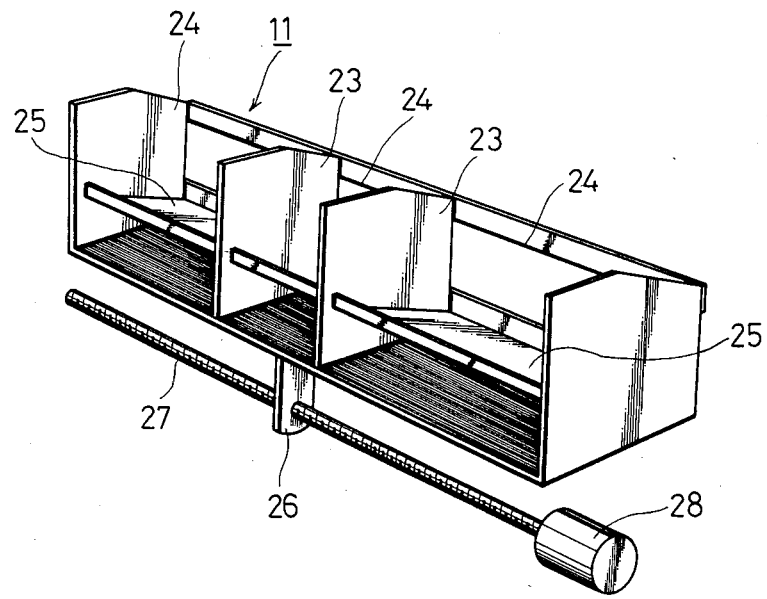
FIG. 4 is a perspective view of the film storage.

Referring first to FIG. 4, the film storage 11 is mounted on the forward end of the support frame 5, extending in the Y direction. The film storage 11 is provided with partitions 23 disposed in differently spaced relationship in the Y direction, so as to define a plurality of film storage compartments 24 of various widths. Each film storage compartment 24 is provided adjacent the bottom thereof with a tilting plate 25 sloping down rearwardly.

The film storage 11 has a travel control bracket 26 depending from the bottom surface thereof, and a ball-bearing screw 27 threadedly extends through the bracket 26. The ball-bearing screw 27 is driven for rotation by a pulse motor 28 secured to the support frame 5 in such a manner that, in response to the direction and amount of rotation of the pulse motor 28, the film storage 11 travels a desired distance along a guide rail (not shown) extending in the Y direction. Centering of a film storage compartment 24 in the apparatus is confirmed by a proximity switch (not shown), and when a desired film storage compartment 24 is centered in the apparatus, the film storage 11 is stopped.

Figure 5:
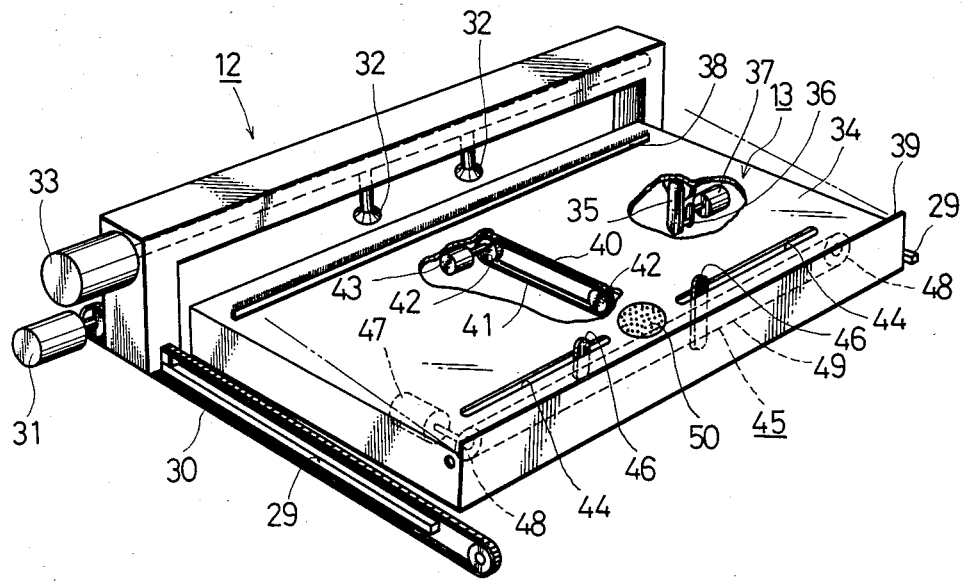
FIG. 5 is a perspective view illustrating the film loader and the film centering platform.

Referring next to FIG. 5, the film loader 12 is disposed in such a manner as to straddle the film centering platform 13, with both ends carried on a pair of rails 29 extending in the X direction from the film storage 11 to the film centering platform 13. A timing belt 30 is mounted to the base portion of one end of the film loader 12 and is driven by a pulse motor 31 secured to the support frame 5 so as to reciprocate the film loader 12 in the X direction.

The film loader 12 has a pair of vacuum grippers 32 mounted on the medial portion thereof. The vacuum grippers 32 are driven by a rotary solenoid 33 secured to one end of the film loader 12 against the biasing force of a spring (not shown) to pivot from horizontal to vertical and, when the rotary solenoid 33 is deactuated, the vacuum grippers 32 are restored to the horizontal state by the spring. When the film loader 12 reaches the stroke end adjacent the film storage 11, the grippers 32 catch under vacuum a separation film stored in a desired film storage compartment 24 and, when the film loader 12 is moved in the X direction above the film centering platform 13, the grippers 32 are released to drop the separation film onto the film centering platform 13.

The film centering platform 13 has an upper plate 34 connected through a crank rod 35 to a crank arm 36 driven by a motor 37 secured to the support frame 5, so that the upper plate 34 is reciprocatingly movable between a position indicated by a solid line and a position by a phantom line in FIG. 5. Adjacent the film storage 11, the film centering platform 13 has a high pressure brush piece 38 for eliminating static electricity of the separation film. The film centering platform 13 also has at its rearward end an upstanding stopper 39 for stopping the separation film falling apart from the vacuum grippers 32 of the film loader 12. Further, the film centering platform 13 has at the medial part thereof a film feeder 40 which has a rubber belt 41 trained around a pair of eccentric pulleys 42, one of which is driven by a motor 43 secured to the support frame 5. With this arrangement, the film feeder 40 is displaceable between an operative position protruding from the film centering platform 13 and a retracted position extending under the film centering platform 13. Thus, when in the operative position, the film feeder 40 advances the separation film fed on the film centering platform 13 upto the stopper 39. Adjacent the stopper 39, the film centering platform 13 is provided with a pair of guide grooves 44 extending in the Y direction. A centering device 45 is provided generally below the guide grooves 44, as illustrated by a phantom line in FIG. 5. The centering device 45 includes a pair of abutment members 46 projecting from the grooves 44 and carried on a chain 49 trained around a pair of pulleys 48, one of which is driven by a motor 47 secured to the support frame 5 of the apparatus. Thus, the abutment members 46 are movable in opposed relationship to each other in the Y direction so as to bring the separation film fed on the film centering platform 13 to the central position in the Y direction. The film centering platform 13 also has at the central portion adjacent the stopper 39 a vacuum section 50 for holding under vacuum the separation film positioned centrally in the Y direction in contact with the stopper 39.

Figure 6:
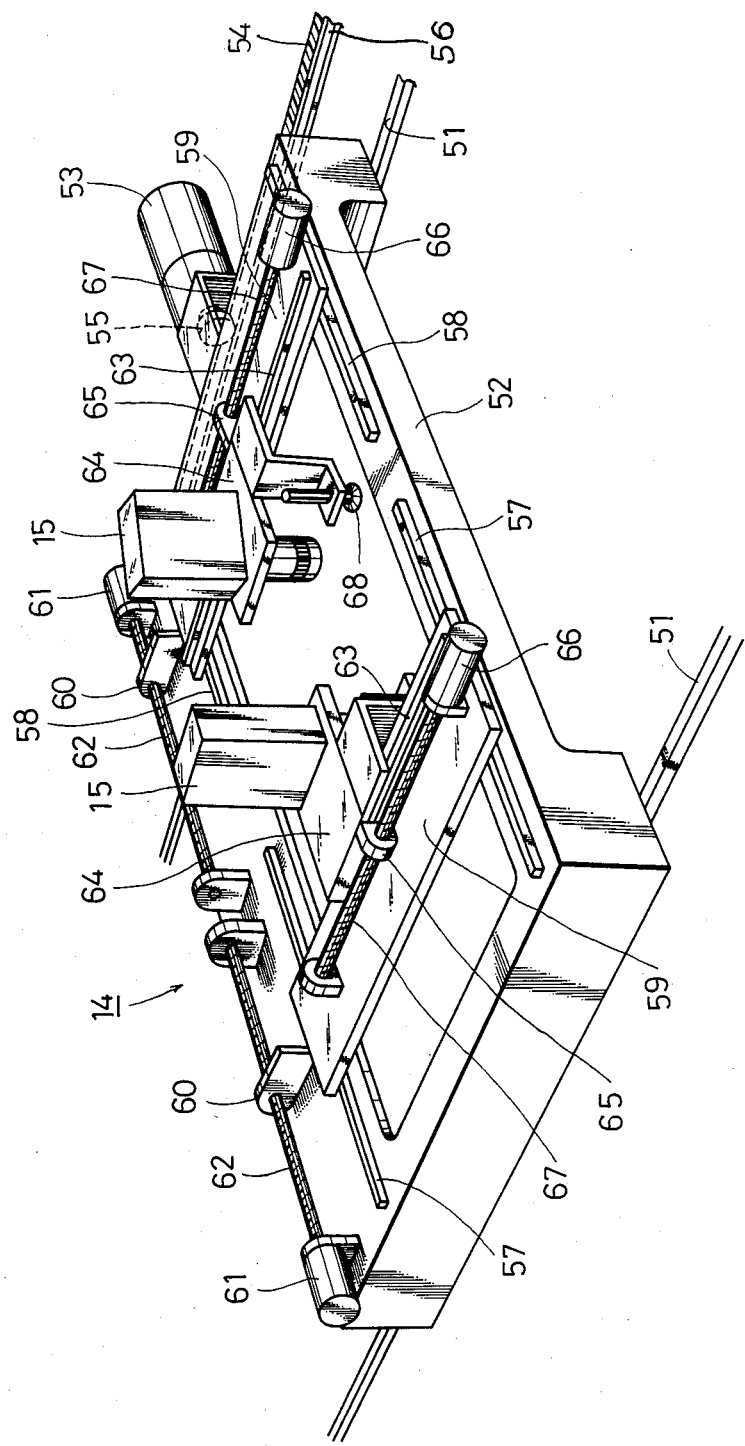
FIG. 6 is a perspective view of the transfer table.

Referring next to FIG. 6, the transfer table 14 has opposite base ends carried on a pair of rails 51 mounted to the support frame 5 and extending in the X direction from the film centering platform 13 to the sensing table 16 and has a table frame 52 disposed in such a manner as to straddle the film centering platform 13 or the sensing table 16. A pulse motor 53 is mounted to the base portion of one end of the table frame 52 so as to reciprocate the transfer table 14 along the rails 51 through a rack 54 and a pinion 55. The pulse motor 53 is operatively associated with a pulse scale 56 having the same length and fixedly provided in the same direction as the rail 51 in such a manner that the length of movement of the transfer table 14 along the rails 51 caused by forward or reverse rotation of the pulse motor 53 is measured by the pulse scale 56.

The table frame 52 are provided with two pairs of rails 57 and 58 extending in the Y direction and arranged symmetrically with respect to each other. A pair of plate frames 59 are carried on the pairs of rails 57 and 58 movably therealong, respectively. Each of the plate frames 59 is provided with a bracket 60 protruding therefrom through which a ball-bearing screw 62 is threadedly extends in such a manner that, in response to forward and reverse rotation of a pulse motor 61 connected to the table frame 52, the plate frame 59 travels a desired distance in the Y direction.

Mounted on the plate frames 59 are parallel rails 63 arranged symmetrically with respect to each other in the Y direction and extending in the X direction, respectively, and a pair of moving plates 64 are carried on the respective rails 63 movably therealong. Each of the moving plates 64 is provided with a bracket 65 protruding therefrom through which a ball-bearing screw 67 is threadedly extends and driven for rotation by a pulse motor 66 in such a manner that, in response to forward and reverse rotation of the pulse motor 66, the moving plate 64 travels a desired distance in the X direction. Each of the moving plates 64 carries the CCD camera 15 for detecting the register marks of the separation film and a vacuum gripper 68, both facing downwardly and respectively arranged symmetrically with respect to the ones on the other moving plate 64. When the transfer table 14 is moved to the film centering platform 13, the vacuum section 50 is deactivated to release therefrom the separation film which is then vacuum held by the vacuum grippers 68, and the transfer table 14 is then moved to the sensing table 16, with the separation film held by the vacuum grippers 44.

Figure 7:
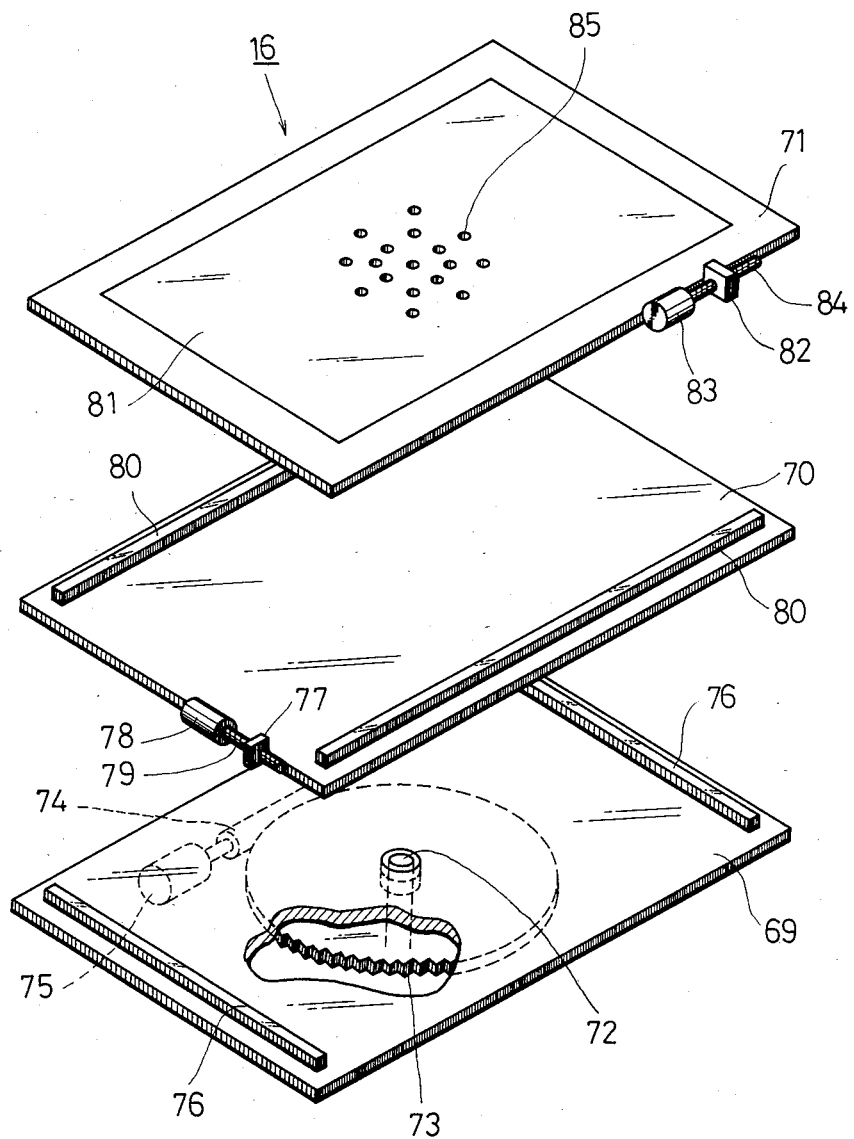
FIG. 7 is a perspective view of the sensing table.

Referring next to FIG. 7, the sensing table 16 includes a rotary frame 69, a X-direction moving frame 70 and a Y-direction moving frame 71. The rotary frame 69 is rotatably supported on the support frame 5 through a supporting shaft 72. A worm wheel 73 is secured to the supporting shaft 72 and operatively connected with a pulse motor 75 through a worm 74. The rotary frame 69 has on the opposite ends thereof a pair of rails 76 extending in the X direction. The X-direction moving frame 70 is carried on the rails 76, and has a bracket 77 protruding therefrom through which a ball-bearing screw 79 threadedly extends and is driven for rotation by a pulse motor 78 fixedly mounted on the rotary frame 69. The X-direction moving frame 70 has adjacent opposite sides thereof a pair of rails 80 extending in the Y direction and on which the Y-direction moving frame 71 is carried. The Y-direction moving frame 71 has carried thereon a light table 81 incorporating a light source for illumination. The Y-direction moving frame 71 also has on one side thereof a bracket 82 protruding therefrom through which a ball-bearing screw 84 threadedly extends and is driven for rotation by a pulse motor 83 fixedly mounted on the X-direction moving frame 70. Numeral 85 indicates vacuum section formed centrally in the light table 81.

When the transfer table 14 is moved to the sensing table 16, the vacuum grippers 68 are deactivated to release therefrom the separation film onto the central portion of the light table 81; the separation film is vacuum held by the vacuum section 85. Then, the CCD cameras 15 precisely measure the positions of the register marks of the separation film and detect the displacements in the X and Y directions and rotational direction (orientation of the separation film) with respect to a point of origin predetermined from the position of the transparent base film on the base film suction platform 19. The detected values are entered to the computer (not shown), which calculates control values responsive to the displacements, and issues commands to the pulse motors 75, 78 and 83 to drive them according to the control values, so that the rotary frame 69, X-direction moving frame 70 and Y-direction moving frame 71 are rotated or moved a predetermined amount in the rotational, X and Y directions, respectively, thereby to accurately position the separation film to the point of origin predetermined with respect to the transparent base film on the base film suction platform 19.

Figure 8:
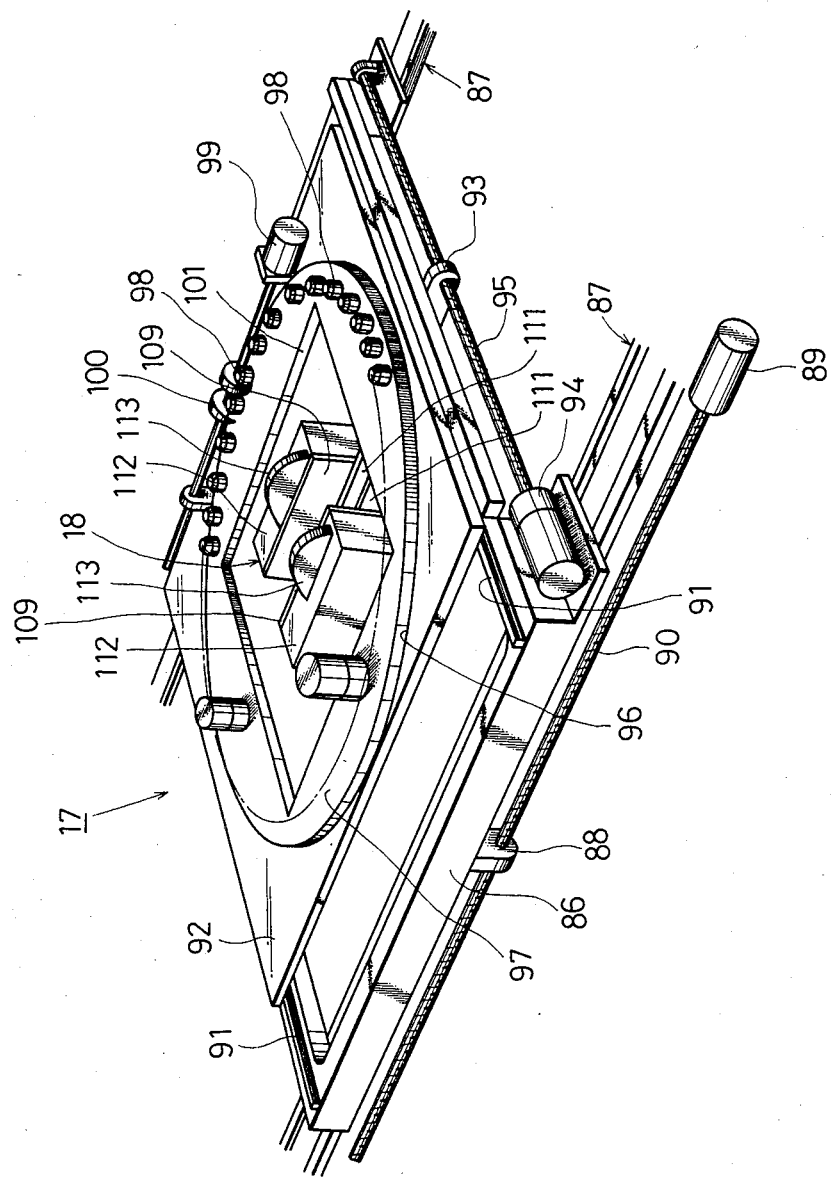
FIG. 8 is a perspective view of the taping table.

Referring next to FIG. 8, the taping table 17 has a table frame 86 disposed in such a manner as to straddle the sensing table 16 or the base film suction platform 19, with both base ends carried on a pair of rails 87 extending in the X direction from the sensing table 16 to the base film suction platform 19. The table frame 86 is provided, depending from one end thereof, with a bracket 88 through which a ball-bearing screw 90 threadedly extends and is driven for rotation by a pulse motor 89. The table frame 86 has adjacent the opposite sides a pair of rails 91 extending in the Y direction. A plate frame 92 is carried at both ends thereof on the rails 91 and is provided with a bracket 93 protruding therefrom through which a ball-bearing screw 95 threadedly extends and is driven for rotation by a pulse motor 94 fixedly mounted on the table frame 86.

The table frame 86 has at the central portion thereof a circular table hole 96, and a circular table plate 97 is loosely fitted in the table hole 96, rotatably supported on the plate frame 92 by a rotary shaft (not shown). The table plate 97 has on the outer peripheral surface thereof gears 98 protrusively formed to provide a worm wheel and engaged with a worm-like gear 100 driven for rotation by a pulse motor 99 fixedly mounted on the table frame 86.

Figure 9:
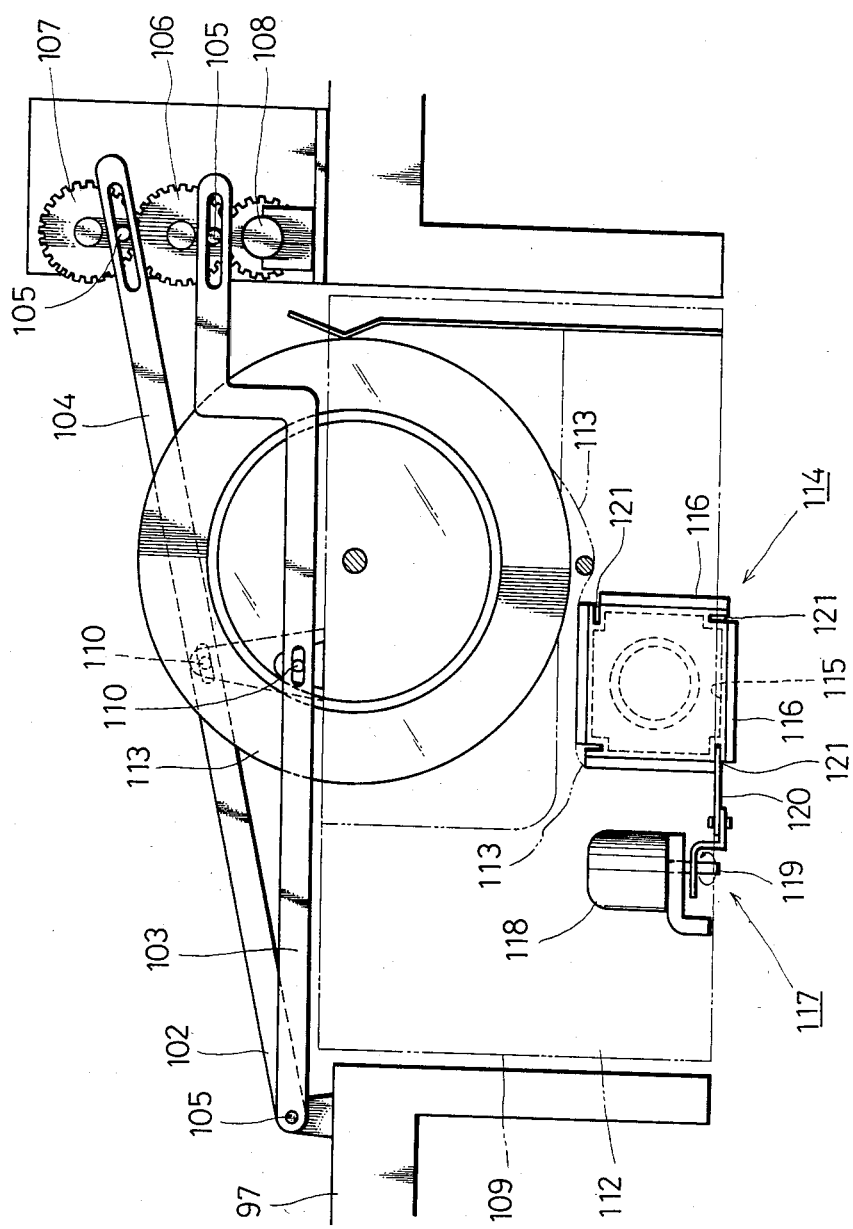
FIG. 9 is a vertical sectional view illustrating the essential parts of the taping frame portion.
Figure 10:
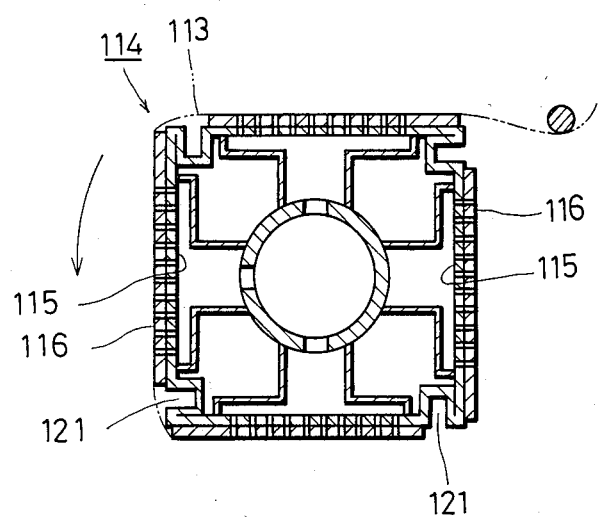
FIG. 10 is a detailed view of the essential parts of the tape winder.

The table plate 97 has at the central portion thereof a window 101, and, as shown in FIG. 9, the table plate 97 has mounted thereon a crank mechanism 102 including suspension rods 103 and 104 connected through pins 105 between the table plate 97 and gears 106 and 107 in such a manner that rotation of the gears 106 and 107 by a motor 108 causes swinging movement of the suspension rods 103 and 104, respectively. The taping device 18 includes a taping frame 109 connected to the suspension rods 103 and 104 through pins 105 so as to move up and down vertically, and received in the window 101. The taping frame 109 is provided with a pair of vacuum grippers 111 depending therefrom and a pair of taping cases 112 disposed in the vicinity of the suction grippers 111. Each pair of the vacuum grippers 111 and the taping cases 112 are engaged with a turnbuckle type screw (not shown) so as to allow the relative space therebetween to be freely expanded and reduced. As shown in FIGS. 9 and 10, a roll of adhesive tape 113 having an adhesive surface on one side (inside) thereof is rotatably supported in each of the taping cases 112. Below the taping cases 112, the taping frame 109 includes a tape winder 114 supported rotatably parallel to the axis of rotation of the adhesion tape 113. The tape winder 114 serves to take up the tape 113. To this end the tape winder 114 is of a generally square configuration having on the outer peripheries thereof porous mesh plates 115 covered with porous sponge 116 of about 1 mm in thickness, and incorporates therewithin suction means (not shown). The rotary shaft of the tape winder 114 is intermittently rotated by 90° by a servomotor (not shown), and the tape winder 114 is so disposed that, when the taping frame 109 reaches its lowermost position, one surface of the outer peripheries of the tape winder 114 comes in face-to-face contact with the transparent base film placed on the base film suction platform 19 with a slight space therebetween.

The taping frame 109 is provided with a tape cutter 117 including a cutter blade 120 fixed to a rotary shaft 119 of a rotary solenoid 118 and adapted to pass through a clearance 121 formed in the tape winder 114 to thereby cut the tape when the taping frame 109 is lowered.

The separation film positioned at the point of origin on the sensing table 16 is vacuum held by the vacuum grippers 111 of the taping table 17 moved to above the sensing table 16, and then conveyed to above the base film suction platform 19. The taping position on the transparent base film for each of the separation films to be relatively positioned from the register marks put thereon is previously stored in the computer in the form of movements in the X, Y and rotational directions from the point of origin, and according to the commands from the computer, the pulse motors 89, 94 and 99 are actuated to introduce the separation film above a proper position on the base film suction platform 19. Then, the taping frame 109 initiates to descend, and when it is lowered until the separation film comes in contact with the transparent base film previously prepared, the vacuum grippers 111 are deactuated, and simultaneously tape from the tape winder 114 is adhered to both ends of the separation film to fix it onto the transparent base film, and at this time, the tape is cut by the blade 120 of the tape cutter 117.

Figure 11:
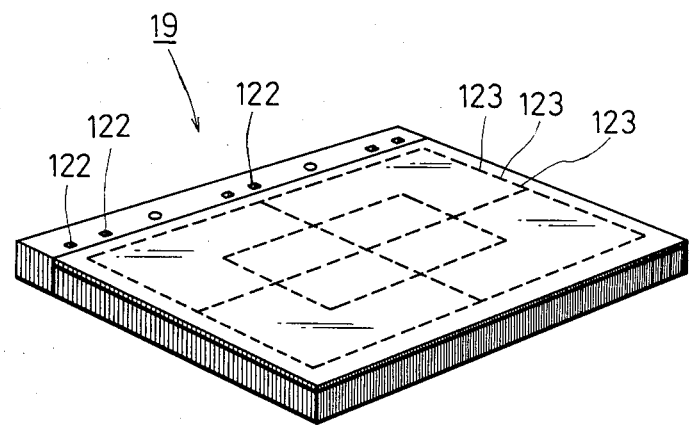
FIG. 11 is a perspective view of the base film suction platform.

Referring next to FIG. 11, the base film suction platform 19 has holes 122 for receiving puncher pins 127 of the base film carrier 20 at predetermined positions on the upper surface and a number of suction holes 123 perforated over the upper surface thereof.

Figure 12:
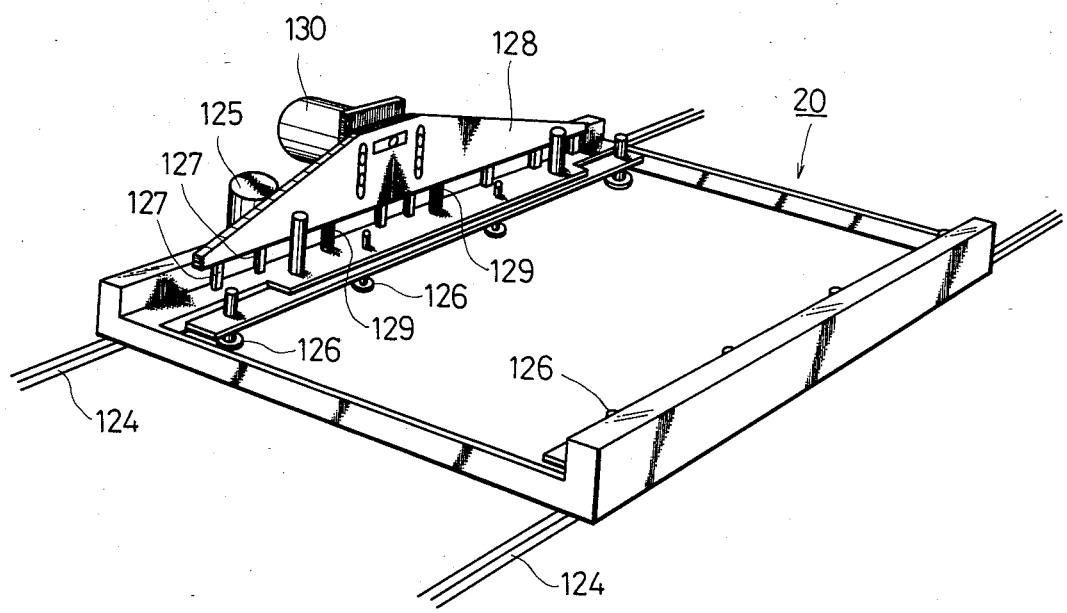
FIG. 12 is a perspective view of the base film carrier.

Referring next to FIG. 12, the base film carrier 20 is a centrally open frame member carried on a pair of rails 124 extending in the X direction from the base film suction platform 19 to the plain base film storage 22 which will be mentioned later, and is moved along the rails 124 by means of a pinion (not shown) which is driven for rotation by a pulse motor 125 and a rack (not shown) on the support frame 5. The base film carrier 20 is provided with a suitable number of vacuum grippers 126 depending from the both ends in the Y direction thereof, and resiliently supports at one end thereof through springs 129 a punch board 128 having puncher pins 127 depending therefrom in aligning relation to the holes 122 of base film suction platform 19. The punch board 128 is operatively connected with a gear-crank mechanism (not shown) which is moved up and down by a pulse motor 130.

Figure 13:
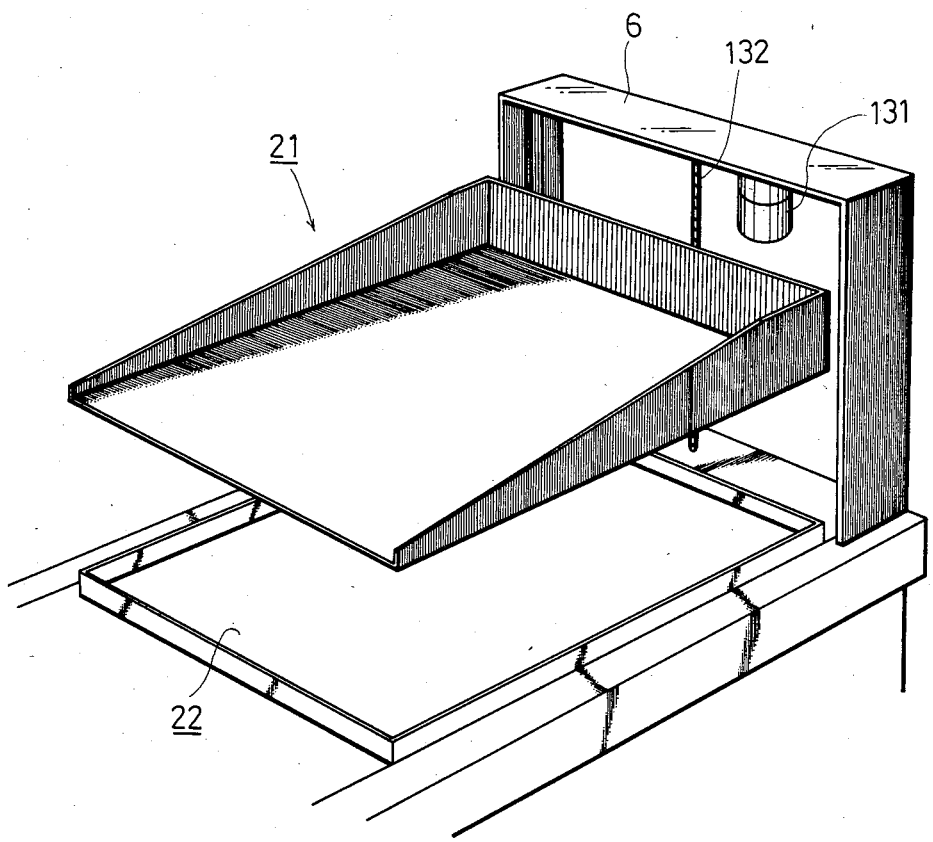
FIG. 13 is a perspective view illustrating the finished film tray and the plain base film storage.

Referring next to FIG. 13, the plain base film storage 22 is disposed at the rearmost end of the process line of the automatic taping apparatus and adapted for storing transparent base films for subsequent use. The finished film tray 21 is disposed above the plain base film storage 22 and operatively connected with a ball-bearing screw 132 which is driven for rotation through a gear (not shown) by a pulse motor 131 mounted to the upstanding frame 6 in such a manner that forward or reverse rotation of the pulse motor 131 causes vertical movement of the finished film tray 21.

The transparent base films stored in the plain base film storage 22 is vacuum held one by one by the vacuum grippers 126 and conveyed to above the base film suction platform 19, where the vacuum grippers 126 are deactuated to release and drop the transparent base film on the base film suction platform 19. Then, as mentioned above, the separation films are in sequence taped to the transparent base film at the predetermined positions and the predetermined orientations. After the operations, the transparent base film is again punched by the puncher pins 127 of the base film carrier 20 and then vacuum held to be moved to the initial position.

During the above operation, the finished film tray 21 is lowered to receive the finished transparent base film. The operations are continuously repeated, permitting rapid and accurate automatic taping of separation films to transparent base films.

Figure 14:
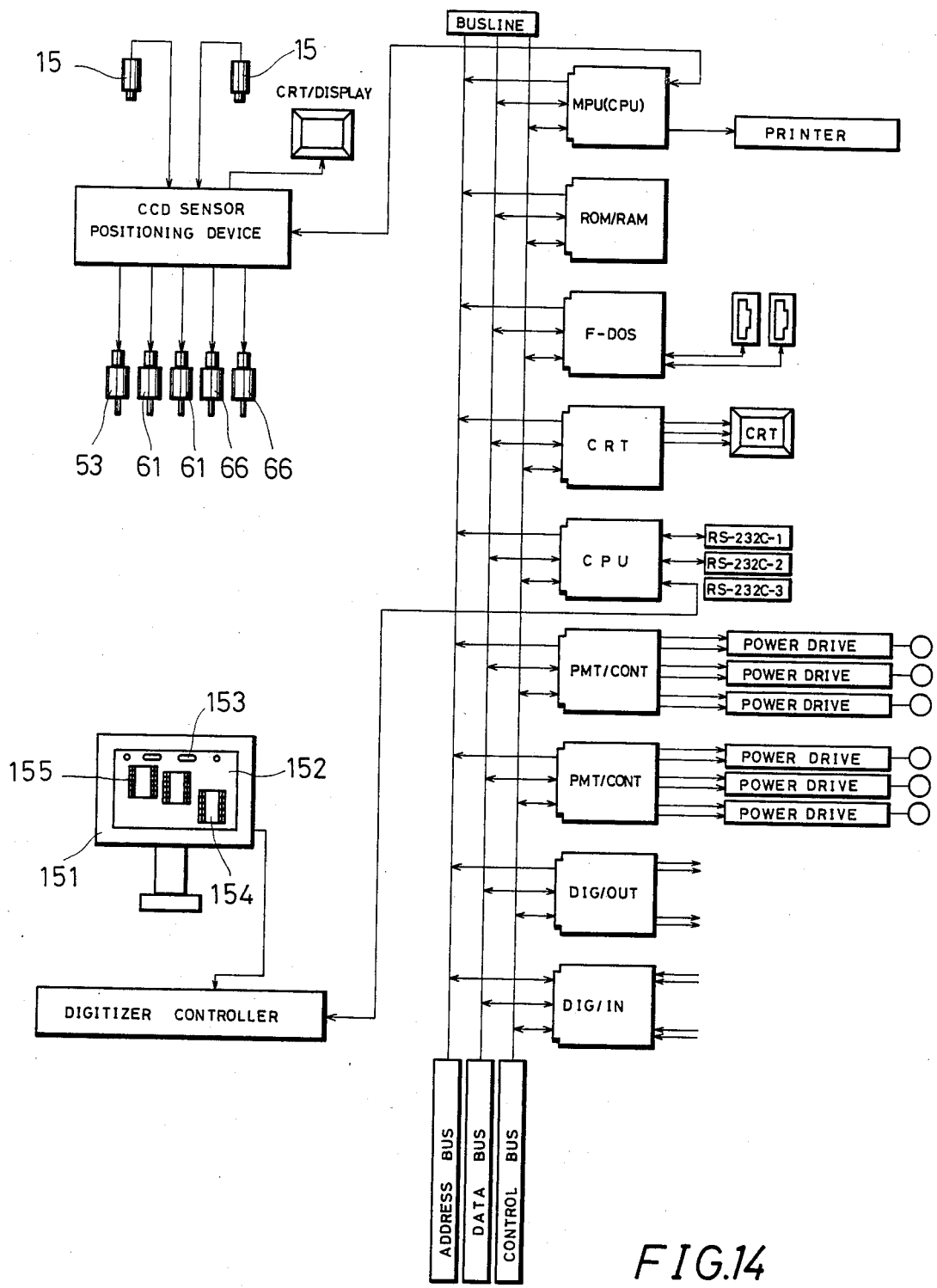
FIG. 14 is a schematic and symbolic diagram of electrical circuit of the present invention.

The operation of the apparatus thus constructed is as follows. As shown in FIG. 14, in order to start the operation of the automatic taping apparatus, the operator first have to prepare a model printing flat so that he can input into the computer the positions of separation films 154 on a base film 152, which depends on the design of printing. To this end, he mounts a base film 152 on a digitizer 151 with punch holes 153 supported on positioning protrusions of the digitizer 151. He then manually tapes separation films 154 on the base film 152 in accordance with the design of printing. With this mannual taping operation completed, he inputs the positions of register marks 155 of the separation films 154 to the computer, in the order in which they are taped on the base film 152.

Now the automatic taping apparatus is ready to process running separation films to be taped on running transparent base films. The running separation films are arranged in the film storage 11 in the taping order with respect to the running base films stored in the plain base film storage 22. On operation of the automatic taping apparatus, one of the base films in the storage 22 is sucked by vacuum grippers 126 of the base film carrier 20 and placed on the base film suction platform 19. Then, the separation films in the film storage 11 are, one by one, temporarily positioned to the central position of the film centering platform 13 by the film loader 12. The separation film thus temporarily positioned on the film centering platform 13 is sucked by vacuum grippers 68 of the transfer table 14 located above the film centering table 13, and moved to the sensing table 16, and then vacuum held thereon. The sensing table 16 positions the register marks of the separation film thereon to the predetermined point of origin. The separation film thus positioned is sucked by vacuum grippers 111 of the taping table 17 and located thereby on the base film on the base film suction platform 19 according to the positioning data of the digitizer 151 stored in ROM/RAM. Then, the taping cases 112 are lowered to tape the separation film onto the base film. Above operations are repeated successively to complete taping of a set of separation films to the base film. The finished base films are stored in the finished film tray 21, and then the next base film is vacuum held on the base film suction platform 19, and the above operations are repeated. Thus, color-separated base films to each of which a plurality of separation films are taped are obtained by the apparatus without any manual operation but completely automatically.

While the invention has been described with reference to a preferred embodiment thereof, it is to be understood that modifications or variations may be easily made without departing from the scope of this invention which is defined by the appended claims.

What is claimed is:

1. A method of taping color separation films on a transparent base film to be used for making a printing plate for reproduction by photoengraving, comprising the steps of:
    inputting to a computer taping orders of the separation films and taping positions on the transparent base film at which the separation films are to be taped on the basis of the X-Y coordinates and setting angle determined from punched holes formed in the transparent base film and crusiform register marks put on the separation films;
    arranging the separation films in the order in which they are to be taped on the transparent base film;
    positioning in sequence the separation films to be taped on the base film to a predetermined point of origin;
    holding in sequence the separation films positioned at the point of origin;
    transferring in sequence the separation films to the taping positions previously stored in the computer; and
    taping in sequence the separation films on the base film.

2. The method as defined in claim 1 wherein, in said positioning step, the separation films are at first moved from a storage compartment to a sepcific position to be temporarily positioned, and thus temporarily positioned separation films are then moved to the point of origin, so that the orientations and positionings of the separation films at the point of origin can be precisely controlled at the point of origin.

3. The method as defined in claim 1 wherein, in said positioning step, at least two register marks of the separation film are detected by two CCD cameras.

4. The method as defined in claim 3 wherein one of the CCD cameras is oriented obliquely with respect to the cross of one of the register marks in such a manner that the intersecting vertical and horiztonal lines of the register mark will extend obliquely with respect to the detecting direction of the CCD camera, so that the positions of at least two register marks are detected by the two CCD cameras to thereby position the separation films at the point of origin.

5. The method as defined in claim 1 wherein, in said transferring step, the orientations of the separation films are changed on the way of movement from the point of origin to the taping positions so as to suit the taping orientations on the base film.

6. An apparatus for taping color separation films on a transparent base film to be used for making a printing plate for reproduction by photoengraving, comprising:
    a support frame having an upstanding frame secured to the rearward end thereof;
    a film storage mounted on the forward end of said support frame and adapted to store a plurality of color separation films classified by sizes in the taping order previously inputted to a computer associated with the apparatus;
    a film loader disposed rearwardly of said film storage and adapted to take out the separation films one after another from said film storage;
    a film centering platform secured to said support frame and adapted to temporarily position the separation film fed from said film loader at a specified location thereon;
    a transfer table movably mounted on said support frame for transferring the separation film positioned on said film centering platform, said transfer table including two CCD cameras for detecting the register marks of the separation film as temporarily located on said film centering platform;
    a sensing table mounted on said support frame and adjustable for movements in longitudinal, transverse and rotational directions, said sensing table serving to precisely position the temporarily-located separation film fed by said transfer table to a predetermined point of origin;
    a base film suction platform mounted on said support frame for releasably holding thereon a running base film on which the separation films are taped;
    a taping table mounted on said support frame generally between said sensing table and said base film suction platform and movable in longitudinal, transverse and rotational directions, said taping table serving to releasably grip the separation film set at the point of origin on said sensing table and transfer the same to said base film suction platform, said taping table including a taping device with adhesive tape to tape the separation film on the running base film held on said base film suction platform;
    a finished film tray mounted on the upper end of said upstanding frame of said support frame;

a plain base film storage mounted on said support frame generally below said finished film tray for storing a plurality of running base films; and a base film carrier movably mounted on said support frame for delivering the finished base film from said base film suction platform to said finished film tray and for feeding a new base film from said plain base film storage to said base film suction platform.

7. The apparatus as defined in claim 6 wherein said taping device of said taping table is lowered along with said adhesive tape so that separation films are automatically taped on the base film held on said base film suction platform.

8. The apparatus as defined in claim 7 wherein said taping device includes a square member disposed generally below said adhesive tape and rotatable by 90 degrees, said square member having porous mesh plates on the outer periphery thereof and being operatively connected to vacuum means provided in the apparatus so that said adhesive tape is vaccum held on said porous mesh plates as it is lowered to the taping position.

* * * * *